United States Patent
Fung

(10) Patent No.: US 7,705,648 B1
(45) Date of Patent: Apr. 27, 2010

(54) DUTY CYCLE DETECTOR WITH HYSTERESIS

(75) Inventor: Juan Paulo Fung, Gilroy, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 444 days.

(21) Appl. No.: 11/697,184

(22) Filed: Apr. 5, 2007

(51) Int. Cl.
*H03K 5/19* (2006.01)
*H03K 3/00* (2006.01)

(52) U.S. Cl. .......................... 327/175; 327/20; 327/205

(58) Field of Classification Search .................. 327/18, 327/20, 26, 35, 175, 176, 205; 324/158, 324/537, 765, 771, 158.1
See application file for complete search history.

(56) References Cited

U.S. PATENT DOCUMENTS

| 4,642,748 A | 2/1987 | Kirk |
| 5,825,211 A * | 10/1998 | Smith et al. .................... 327/19 |
| 6,285,174 B1 | 9/2001 | Suzuki |
| 6,812,782 B2 | 11/2004 | Grant |
| 7,414,438 B1 * | 8/2008 | Nulsen et al. .................. 327/18 |

OTHER PUBLICATIONS

Lin, Ray L., and Lee, Fred C., Single-Power-Supply-Based Transformerless IGBT/MOSFET Gate Driver with 100% High-Side Turn-on Duty Cycle Operation Performance Using Auxiliary Bootstrapped Charge Pumper, Virginia Power Electronics Center, Virginia Polytechnic Institute and State University, 1997, [1205-1209].

* cited by examiner

*Primary Examiner*—Gary L Laxton
(74) *Attorney, Agent, or Firm*—Darby & Darby PC; Matthew M. Gaffney

(57) ABSTRACT

A circuit for monitoring a PWM signal and providing an output indicating a condition of the PWM signal. The circuit also uses condition based hysteresis to maintain an output value at a previous state until the condition of the PWM signal has remained unchanged for a given duration. In addition, the circuitry may be used in conjunction with a switching regulator to reduce switching noise during high duty cycle operation.

17 Claims, 9 Drawing Sheets

DUTY CYCLE DETECTOR WITH HYSTERESIS

TECHNICAL FIELD

The invention is generally directed to the area of the monitoring signal conditions in electrical devices, systems, and circuits. The invention is directed, particularly, but not exclusively to an apparatus and a method for determining if signal is pulse width modulated and to a regulator and a method of regulation using such determination.

BACKGROUND OF THE INVENTION

Pulse width modulation (PWM) of signals and PWM signals are used to provide control and communications within and between a variety of electrical devices, systems, and circuits. For example, PWM signals may be used in power supply applications to regulate output voltage or current; in motor control applications to control the speed of a motor; in audio applications for the amplification and processing of audio signals; in communications applications for encoding, transmitting, and decoding data; etc.

PWM signals may be characterized by the modulation of the duty cycle of a periodic signal. For example, a PWM signal may be a periodic square wave voltage signal whose duty cycle (a relationship of the duration of a phenomenon during a given period to the duration of the period) may vary to change the average value of the signal. The duty cycle of a PWM signal may change from cycle to cycle, may change slowly over an extended period, or may be relatively constant, as determined by each particular application. Changes in duty cycle may increase or decrease the duty cycle as long as the duty cycle is greater than zero percent and less than one hundred percent. A PWM signal may also have different shapes. For example, a triangular signal, a saw-tooth signal, a pseudo-sinusoidal signal, and/or the like, could be PWM modulated to carry control, communication or other data.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

Various embodiments of the present invention will be described in detail with reference to the drawings. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference. References in the singular are made merely for clarity of reading and include plural reference unless plural reference is specifically excluded. The meaning of either "in" or "on" includes both "in" and "on." The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function or functions. The term "signal" means at least one current, voltage, charge, temperature, data, or other signal. A "signal" may be used to communicate using active high, active low, time multiplexed, synchronous, asynchronous, or any other digital or analog signaling or modulation techniques. The phrase "in one embodiment," as used herein does not necessarily refer to the same embodiment, although it may.

Briefly stated, the invention is related to circuitry and a method for monitoring a signal and providing an output indicating a condition of the signal. The circuit and method may also utilize condition based hysteresis to maintain an output value at a previous state until the condition of the signal has remained unchanged for a given duration. In addition, the circuitry and method may be used in conjunction with a switching regulator to improve output regulation.

Figure 1:
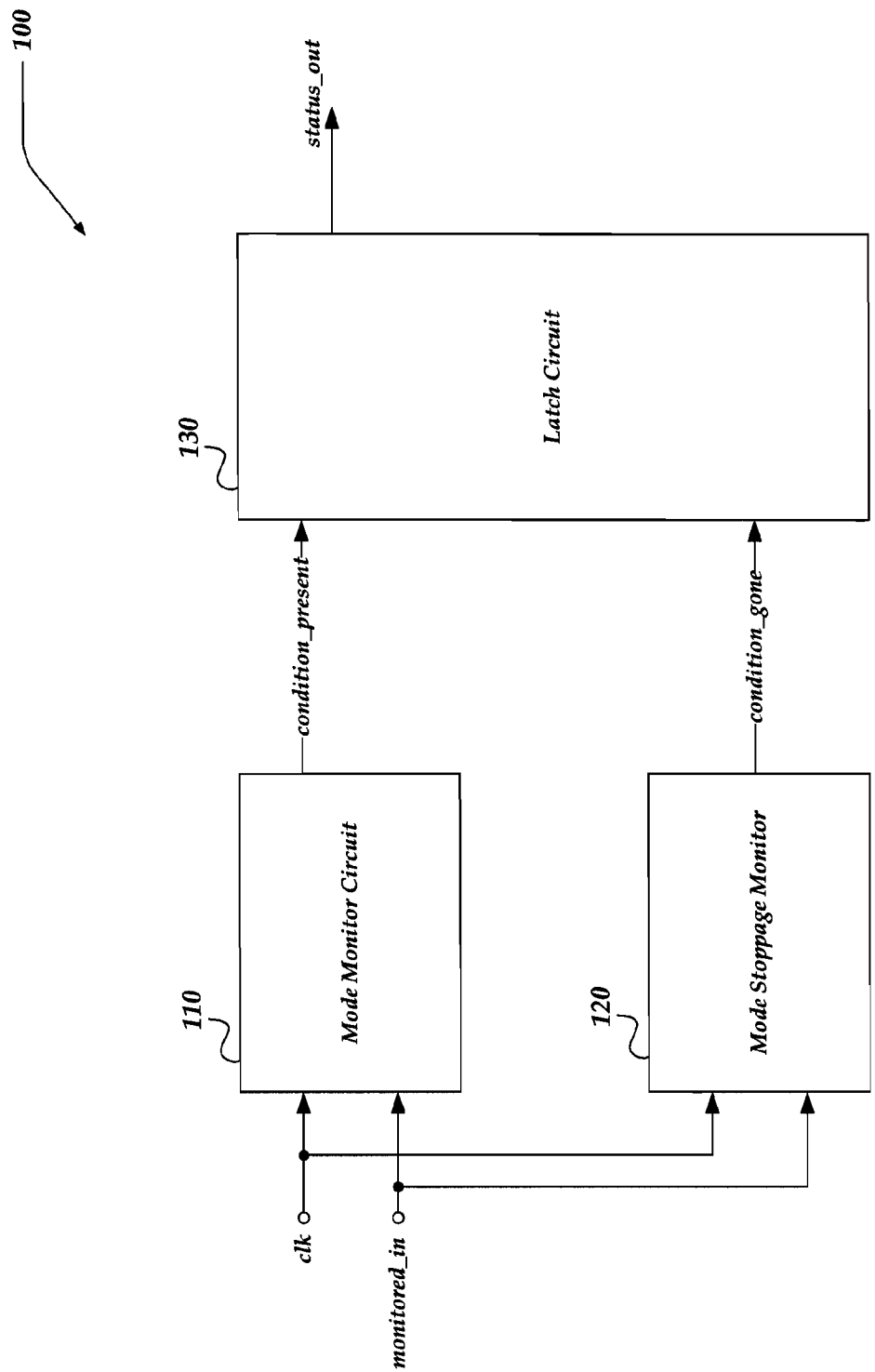
FIG. 1 is a block diagram showing a condition detector according to an embodiment of the present invention.

FIG. 1 is a block diagram showing condition detector 100 according to an embodiment of the present invention. Condition detector 100 includes mode monitor circuit 110, condition stoppage monitor 120, and latch circuit 130. Condition detector 100 is arranged to receive clock input signal clk and input signal monitored_in, and to provide output signal status_out.

Condition detector 100 is arranged to detect and monitor an operational state on input signal monitored_in and to provide output signal status_out to indicate the determined operational state. Condition detector 100 is further arranged to provide output hysteresis to delay the transition of signal status_out until monitored_in has been in the operational state for a suitable duration.

Mode monitor circuit 110 is arranged to monitor input signal monitored_in to determine if signal monitored_in is in a first operational state and to assert output signal condition_present after signal monitored_in has been in the first operational state for a sufficient duration. The first operational state may correspond to conditions such as rapid input transitions, excessive voltage, excessive current, insufficient voltage, insufficient current, improper biasing, lack of switching, and/ or the like. In one embodiment, input signal clk is used to ascertain a length of time for the sufficient duration. In other embodiments, other time keeping methods may be suitably used. In one embodiment, delay stages, edge detectors, timers, and other state-based or combinatorial circuits may be suitably used to determine whether signal monitored_in is in the first operational state which corresponds to these and other conditions. Any other suitable circuits, means, and/or techniques may be used to ascertain whether signal monitored_in is in the first operational state and are within the sprit and scope of the invention.

Mode stoppage monitor 120 is arranged to monitor input signal monitored_in and to determine if signal monitored_in is in a second operational state for a sufficient duration. In one embodiment, the second operational state may be the converse of the first operational state. In other embodiments, the second operational state may correspond to other conditions, such as those discussed above. In one embodiment, mode stoppage monitor 120 is arranged to receive inputs signals clk and signal monitored_in and to provide an output signal condition_gone to indicate whether mode stoppage monitor 120 has determined that signal monitored_in is in a second operational state. Any suitable circuits, means, and/or techniques, including those discussed above, may be used to ascertain if signal monitored_in is in the second operational state corresponding to these and other conditions. These and other embodiments are within the spirit and scope of the invention.

Latch circuit 130 is arranged to receive inputs from mode monitor circuit 110 and mode stoppage monitor 120 and to provide latched output signal status_out to indicate the operational state of input signal monitored_in. In one embodiment, signal status_out is a digital signal that is either asserted or de-asserted to indicate whether monitored_in has been determined to be in the first or second operational state. For example, latch circuit 130 may be arranged to assert signal status_out if input signal condition_gone is asserted and to de-assert signal status_out if signal condition_present is asserted. However, in other embodiments, signal status_out may be a single signal or multiple signals and may be used to indicate other or additional information regarding the status of signal monitored_in. For example, signal status_out may indicate the status of signal monitored_in, a confidence level of the status determination, historical information regarding signal monitored_in, and/or the like. Latch circuit 130 may be either an analog or digital circuit.

Condition detector 100 is arranged to provide hysteresis to stabilize output signal status_out. In one embodiment, the degree of assertion and de-assertion hysteresis is related to the number of clock cycles during which monitored_in is the first operational state or the second operational state before mode stoppage monitor 120 or mode monitor circuit 110 transition their respective output signals. These numbers of clock cycles may be predefined as any suitable number and may be based, at least, on the hysteresis requirements of a particular application. In other embodiments, a digital timer, analog timer, input clock signal clk, a different clock signal, and/or the like may be used to suitably provide hysteresis.

In some embodiments, the assertion and de-assertion hysteresis is symmetrical (e.g., the same number of clock cycles or the same length of time). However, in other embodiments, asymmetrical hysteresis is provided. Likewise, the degrees of assertion and de-assertion hysteresis may be defined at any suitable time. For example, in one embodiment, hysteresis is defined during the design phase of a circuit or device and is based on simulations or design calculations. In other embodiments, the hysteresis is defined during the manufacturing or fabrication processes and is based on performance testing or other measured data. In yet other embodiments, the degrees of hysteresis are user configurable, automatically real-time configurable, and/or the like, and may be configured, for example, using a micro-processor interface, pull-up resistors, pull-down resistors, manually actuated switches, register settings, and/or the like.

Some embodiments of condition detector circuits, as disclosed herein, can be employed, for example, to detect whether a signal is pulse width modulated. Such determination may provide information about the performance of an electrical device, system, or circuit. For example, a circuit that usually outputs a modulated PWM signal could cease providing modulation on the signal. This may indicate that the circuit is in an abnormal state of operation such as in an error condition, is performing at sub-optimal levels, and/or the like.

Figure 2:
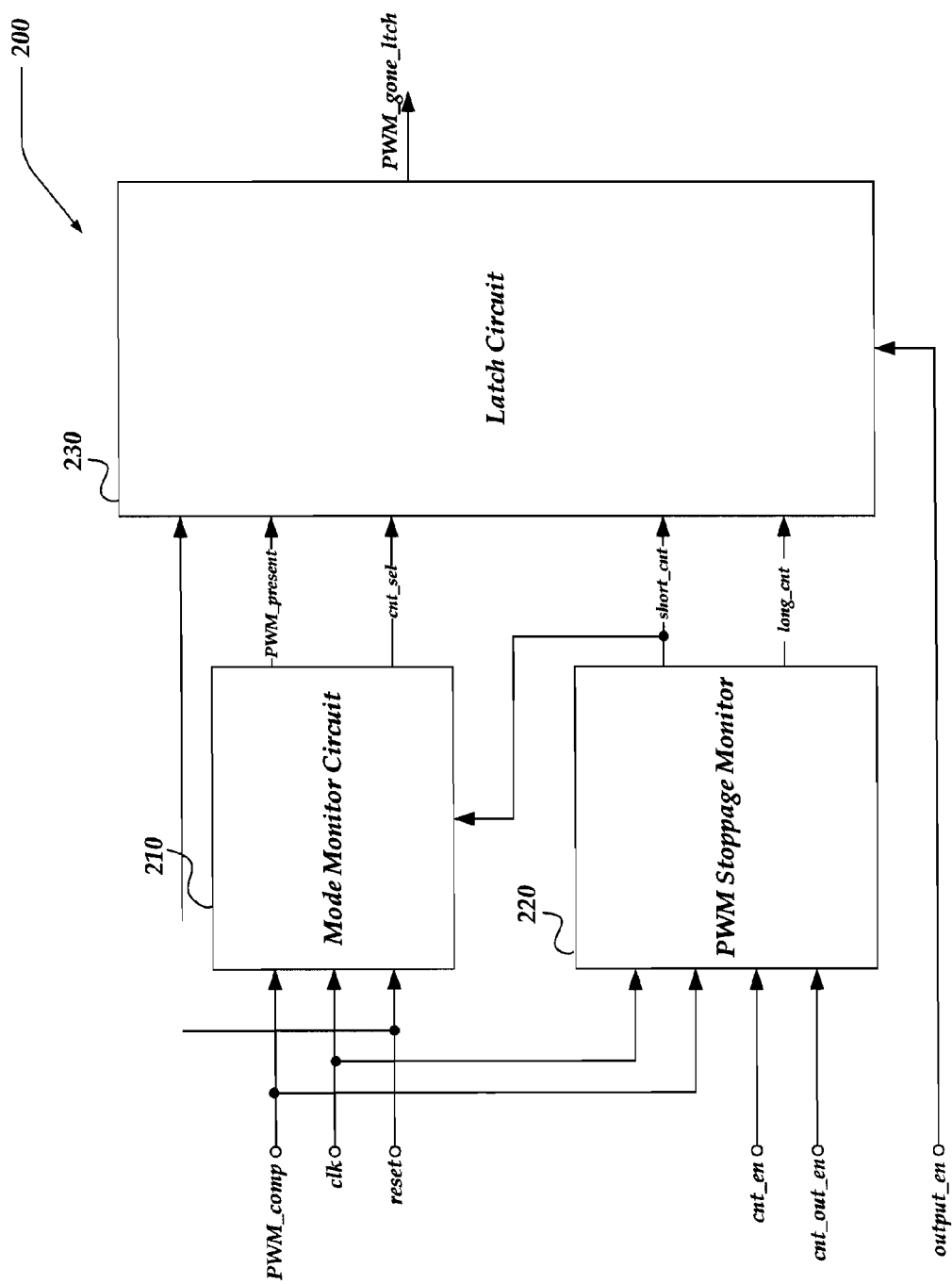
FIG. 2 is a block diagram showing an embodiment of a duty cycle detector according to aspects of the present invention.

FIG. 2 is a block diagram showing an embodiment of duty cycle detector 200, which may be employed as an embodiment of condition detector 100 of FIG. 1, wherein input signal PWM_comp and output signal PWM_gone_ltch of FIG. 2 correspond to input signal monitored_in and output signal status_out, respectively of FIG. 1.

One embodiment of duty cycle detector 200 is arranged to determine if input signal PWM_comp is in a first operational state which corresponds to the presence of PWM switching on signal PWM_comp or is in a second operational state which corresponds to the absence of PWM switching on signal PWM_comp.

Duty cycle detector 200 includes mode monitor circuit 210, PWM stoppage monitor 220 and latch circuit 230; is arranged to receive input signals PWM_comp and clk; and is further arranged to provide output signal PWM_gone_ltch. Duty cycle detector 200 is also arranged to receive signal reset, signal cnt_en, signal cnt_out_en, and signal output_en. PWM stoppage monitor 220 is arranged to provide output signals short_cnt and long_cnt, and mode monitor circuit 210 is further arranged to provide output signal cnt_sel and output signal PWM_present. The functions of these signals are discussed below.

In one embodiment, duty cycle detector 200 is arranged to detect and monitor PWM switching status on input signal PWM_comp and to provide output signal PWM_gone_ltch to indicate the PWM switching status. Duty cycle detector 200 is further arranged to provide hysteresis of PWM switching detection.

In one embodiment, mode monitor circuit 210 and latch circuit are arranged to receive input signal reset. In one embodiment, all the timers, counters, state-machines, flip-flips, latches, and/or the like, within mode monitor circuit 210 and latch circuit 230, are cleared or preset when signal reset is asserted. In other embodiments, only some of these elements are cleared when signal reset is asserted. Signal reset may be provided by an internal or external circuit, device, system, and/or the like, and may be asserted, for example, during start up, before shut down, following a mode change, before a mode change, and/or at any other suitable time. In one embodiment, PWM stoppage monitor 220 is not arranged to receive the signal reset. However, in other embodiments, PWM stoppage monitor 220 and/or other circuitry may be arranged to receive signal reset.

In one embodiment, PWM stoppage monitor 220 is arranged to receive input signal cnt_en and utilize signal cnt_en to enable or disable counters within PWM stoppage monitor 220. For example, if signal cnt_en is asserted, counters are cleared and counting is suspended. In an alternate embodiment, PWM stoppage monitor 220 may be arranged to maintain but not change a value stored on a counter while signal cnt_en is asserted. In yet another embodiment, counters may be arranged to exhibit different behavior when signal cnt_en is asserted. For example, a first counter may be cleared and the count on a second counter may be maintained. Other suitable combinations may also be employed in other embodiments.

In the embodiment shown in FIG. 2, PWM stoppage monitor 220 is arranged to receive and utilize input signal cnt_out_en to enable or disable output signals short_cnt and long_cnt. Signal cnt_out_en may be provided by an internal or external circuit, device, system, and/or the like, and may be asserted, for example, during start up, before shut down, following a mode change, before a mode change, and/or at any other suitable time. In one embodiment, signal cnt_out_en, is asserted during reset and de-asserted following a suitable delay after the de-assertion of reset. This provides additional time for input signals clk and PWM_comp to stabilize and reach normal operating conditions. In other embodiments, signal reset may be used instead of, or in conjunction with, signal cnt_out_en.

In one embodiment, latch circuit 230 is arranged to receive and utilize signal output_en to gate the assertion of output signal PWM_gone_ltch. For example, signal output_en may be provided to an AND gate, a tri-state driver, and/or the like such that signal PWM_gone_ltch is not asserted while signal output_en is de-asserted.

In one embodiment, PWM stoppage monitor 220 is arranged to provide output signals short_cnt and long_cnt to latch circuit 230 to indicate, for example, whether PWM switching have been missing from input signal PWM_comp for at least two different predefined numbers of clock cycles. In certain embodiments, PWM switching is considered missing when input signal PWM_comp has not changed state at least once during a clock cycle.

In other embodiments, PWM stoppage monitor 220 is arranged to provide more than two output signals. For example, three, six, eight, or any other number of output signals may be provided.

In one embodiment, mode monitor circuit 210 is arranged to provide output signal cnt_sel to latch circuit 230 to indicate, for example, a selection between the various output signals of PWM stoppage monitor 220. In the embodiment shown in FIG. 2, signal cnt_sel is utilized to provide one bit of information and to select between latch circuit 230 input signals short_cnt and long_cnt. In another embodiment, signal cnt_sel is a multi-bit signal that may be utilized to select between more than two input signals. In addition to selecting between multiple inputs of latch circuit 230, the status of signal cnt_sel may also be indicative of an operational state of the circuit. For example, signal cnt_sel may be asserted to indicate that the circuit is operating in a PWM mode and is de-asserted to indicate a non-PWM operating mode.

Figure 3:
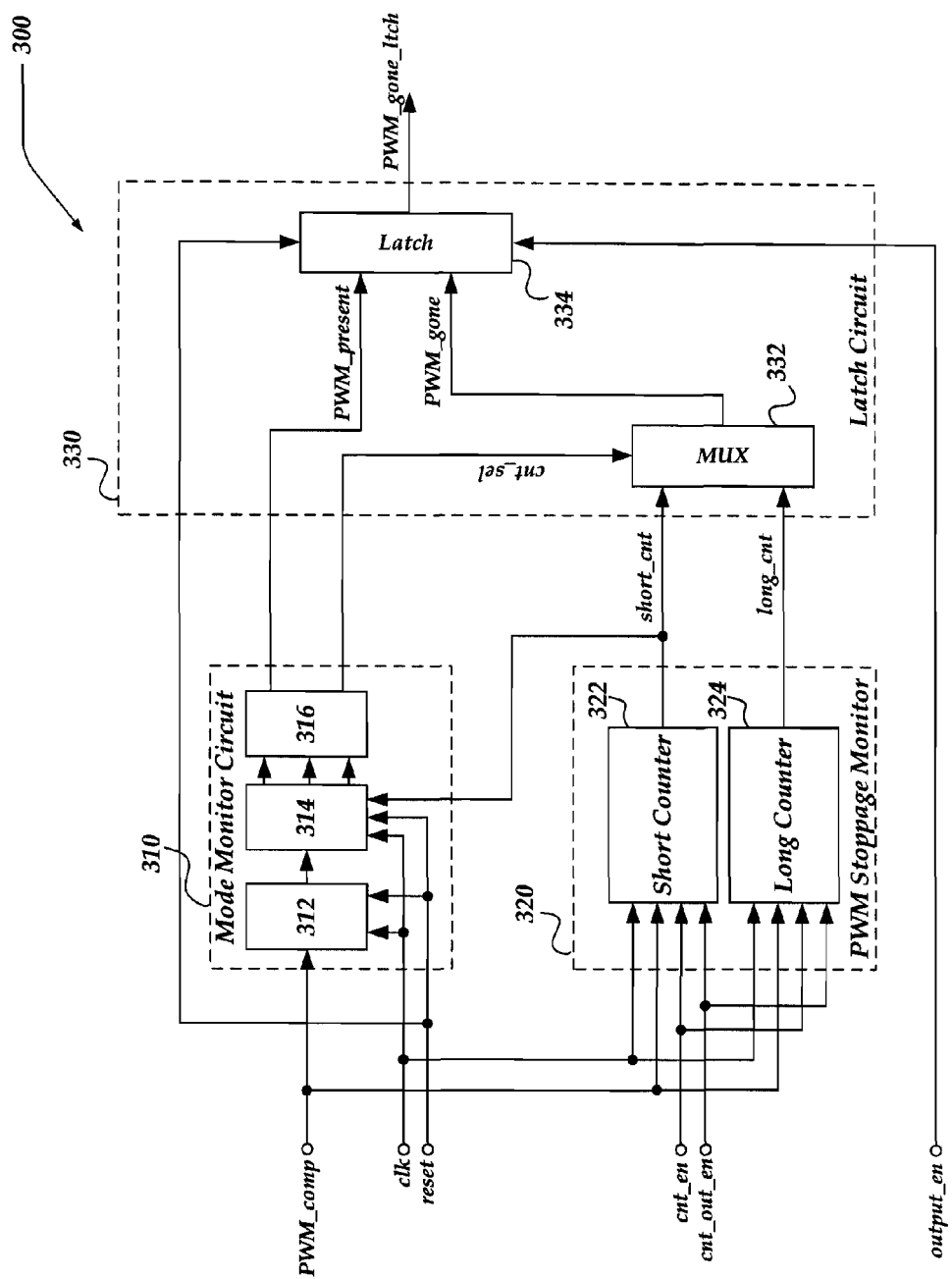
FIG. 3 is a block diagram showing an embodiment of another duty cycle detector according to aspects of the present invention.

FIG. 3 is a block diagram showing an embodiment of duty cycle detector 300 according to aspects of the present invention. Duty cycle detector 300 may be an embodiment of duty cycle detector 200 of FIG. 2.

In one embodiment, mode monitor circuit 310 is arranged to monitor input signal PWM_comp to ascertain if PWM switching is present on signal PWM_comp. In certain embodiments, PWM switching is considered present when input signal PWM_comp changes state at least once during each clock cycle. In one embodiment, mode monitor circuit 310 counts the number of consecutive clock cycles in which there is PWM switching is present on input signal PWM_comp.

In the embodiment depicted in FIG. 3, mode monitor circuit 310 is arranged to provide two output signals: PWM_present and cnt_sel. In this embodiment, mode monitor circuit 310 is arranged to assert signal PWM_present when PWM switching has been present for a first predefined number of consecutive clock cycles. In the same embodiment, mode monitor circuit 310 is arranged to assert signal cnt_sel when PWM switching has been present for a second predefined number of consecutive clock cycles. For example, signal PWM_present may be used to de-assert output signal PWM_gone_ltch, and the cnt_sel signal may indicate an operational state of duty cycle detector 300. In one embodiment, the first predefined number of clock cycles is less than the second predefined number of clock cycles. In other embodiments, this may be reversed, or the first and second predefined numbers of clock cycles may be the same. In one embodiment, mode monitor circuit 310 includes PWM switching presence detector 312, counter chain 314, and output block 316. Mode monitor circuit 310 may be arranged to use other means to determine if PWM switching is present on signal PWM_comp. For example, delay stages, edge detectors, timers, and other state-based or combinatorial circuits may be suitably arranged to determine the presence of PWM switching Mode monitor circuit 310 is arranged to provide output signals PWM_present and cnt_sel, which may be latched or unlatched. In one embodiment, signal PWM_present is a latched output which is asserted to indicate whether PWM switching has been present during each clock cycle for five consecutive clock cycles and signal cnt_sel is a latched output which is asserted to indicate that at least nine such clock cycles have elapsed. In an embodiment such as the one shown in FIG. 3, mode monitor circuit 310 is arranged to receive input signal short_cnt from PWM stoppage monitor 320 and to clear or reset mode monitor circuit 310, one or more output signals, counters, and/or the like, when signal short_cnt is asserted. For example, signals PWM_present and cnt_sel may be cleared when short_cnt is asserted. In other embodiments, there may be other or more outputs, signals, counters, latches, and/or the like.

In one embodiment, PWM stoppage monitor 320 is arranged to count the number of clock cycles during which PWM switching is absent. In certain embodiments, PWM switching is considered absent when there is a clock cycle during which input signal PWM_comp does not change state. In other words, in these embodiments, PWM switching is considered absent when the duty cycle is at zero percent or 100 percent. PWM stoppage monitor 320 is further arranged to receive input signals clk and PWM_comp and to provide output signals which indicate whether PWM switching has been absent for predefined numbers of clock cycles, as discussed above. In one embodiment, PWM stoppage monitor 320 is arranged to ascertain whether PWM switching has been absent for predefined numbers of clock cycles by counting these clock cycles with short counter 322 and long counter 324.

In this embodiment, short counter 322 and long counter 324 are arranged to assert short_cnt and long_cnt, respectively, when their respective counts are reached. In certain embodiments, short counter 322 is arranged to count a predefined number of clock cycles which is less than the predefined number of clock cycles counted by long counter 324. However, short counter 322 and long counter 324 may count any suitable number of clock cycles. In other embodiments, mode stoppage monitor 320 employs other circuits, means, and/or techniques to determine if PWM switching is absent from signal PWM_comp. For example, delay stages, edge detectors, timers, and other state-based or combinatorial circuits may be suitably used to determine the absence of PWM switching.

The embodiment of latch circuit 330 shown in FIG. 3 is further arranged to receive inputs from mode monitor circuit 310 and PWM stoppage monitor 320, and to provide output signal PWM_gone_ltch to indicate whether mode stoppage monitor 320 has determined that PWM switching is absent from signal PWM_comp. One embodiment of latch circuit 330 includes multiplexer (MUX) 332 and latch 334. In certain embodiments, multiplexer 332 is a 2:1 multiplexer arranged to provide output signal PWM_gone to latch 334 based on the values of input data signals short_cnt and long_cnt and input selection signal cnt_sel. In this embodiment, the status of signal cnt_sel may be indicative of an operational state of the circuit. In other embodiments, multiplexer 332 may be arranged to have a different ratio of inputs to a single output or a plurality of outputs. Those skilled in the art will recognize that latch circuit 330 may be suitably modified to receive any number of input data signals representing, for example, whether PWM mode switching has been absent for various numbers of clock cycles. Likewise, any suitable number of selection signals may be used to select between multiple input data signals.

In one embodiment, latch 334 is an R\S \latch that includes an output enable input. However, in other embodiments, any suitable type of latching circuit may be employed. For example, other flip-flops, latches, state machines, and/or the like may be combined with combinatorial logic, as appropriate. As illustrated in this embodiment, latch 334 is arranged to assert signal PWM_gone_ltch if signal PWM_gone is asserted and to de-assert signal PWM_gone_ltch if either signal reset or signal PWM_present is asserted.

Duty cycle detector 300 may be more fully understood in light of the following operational description of one embodiment. During circuit or device power up, signal reset is asserted. While signal reset is asserted, mode monitor circuit 310 and latch circuit 330 are reset and remain in a default state. After reset, mode monitor circuit 310 determines when PWM switching on input PWM_comp has begun. At this point, mode monitor circuit counts the number of consecutive clock cycles in which PWM switching is present.

After PWM switching has been present for a first defined number of consecutive clock cycles, mode monitor circuit 310 asserts output PWM_present. After PWM switching has been present for a second defined number of consecutive clock cycles, mode monitor circuit 310 asserts output cnt_sel and multiplexer 332 of latch circuit 330 is configured to provide signal short_cnt to latch 334. At a later time, PWM switching on input signal PWM_comp ceases. PWM stoppage monitor 320 then detects this condition and counts the number of clock cycles during which PWM switching are absent. After a defined number of such clock cycles, short counter 322 asserts short_cnt, which in turn, sets latch 334, asserts output signal PWM_gone_ltch, and resets mode monitor circuit 310.

If PWM switching is later reestablished, mode monitor circuit 310 asserts output PWM_present to clear latch 334 after PWM switching has been present for the first defined number of consecutive clock cycles. In this example, long counter 324 is arranged to assert output signal PWM_gone_ltch via latch 334 when cnt_sel is not asserted. This may prevent oscillations on output signal PWM_gone_ltch when, for example, PWM_gone_ltch has recently changed state.

Figure 4:
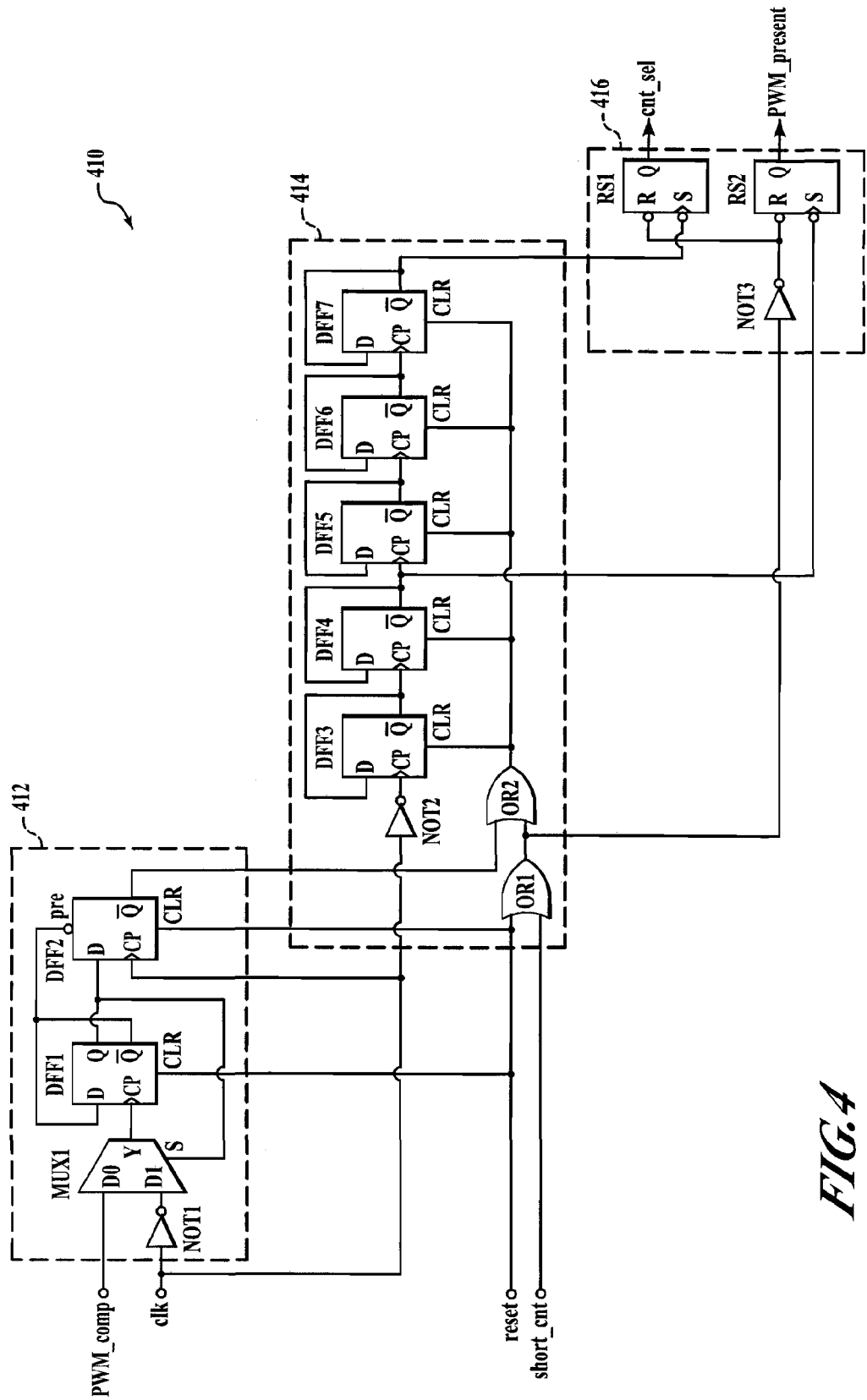
FIG. 4 is a schematic showing an embodiment of a mode monitor circuit according to aspects of the present invention.

FIG. 4 is a schematic showing an embodiment of mode monitor circuit 410 according to aspects of the present invention. Mode monitor circuit 410 may be an embodiment of mode monitor circuit 310 of FIG. 3. Mode monitor circuit 410 includes PWM switching presence detector 412, counter chain 414, and output block 416.

PWM switching absence detector 412 includes inverter NOT1, multiplexer MUX1, and flip-flops DFF1-DFF2. In this embodiment, PWM switching absence detector 412 resets counter chain 414 if it has not detected a rising edge transition on PWM_comp while clock input clk is low. In other embodiments, other circuits are arranged to detect the absence of PWM switching. For example, delay stages, edge detectors, timers, and other state-based or combinatorial circuits may be suitably used to determine the absence of PWM switching.

Counter chain 414 includes OR gates OR1-OR2, inverter NOT2 and flip-flops DFF3-DFF7 and is arranged to count the number of falling edges on clock signal clk since counter chain 414 was last reset. Other counters may be used to count any number of clock cycles or clock edges. For example, counters including ring counters, Johnson counters, decade counters, shift registers, up counters, down counters, up-down counters, and/or the like, may be suitably used. In addition, any numbers or type of combinatorial logic and flip-flops (both rising edge and falling edge triggered) may also be suitably employed.

In this embodiment, output block 416 includes inverter NOT3 and latches RS1-RS2. In the same embodiment, output block is arranged to assert cnt_sel when counter chain 414 has counted to 32 and to assert PWM_present when counter chain 414 has counted to four. In other embodiments, these and other signals may be asserted or de-asserted at any count value. Such count values may be any value, including even numbers, odd numbers, numbers that are an integer exponential of base 2, and numbers that are not an integer exponential of base 2. In yet another embodiment, latch RS2 is omitted and output signal PWM_present is provided as an unlatched output.

Input signals reset and short_cnt are utilized in conjunction with OR gates OR1-OR2 and inverter NOT2, in one embodiment. This functions to reset all or part of mode monitor circuit 410, as discussed above.

Figure 5:
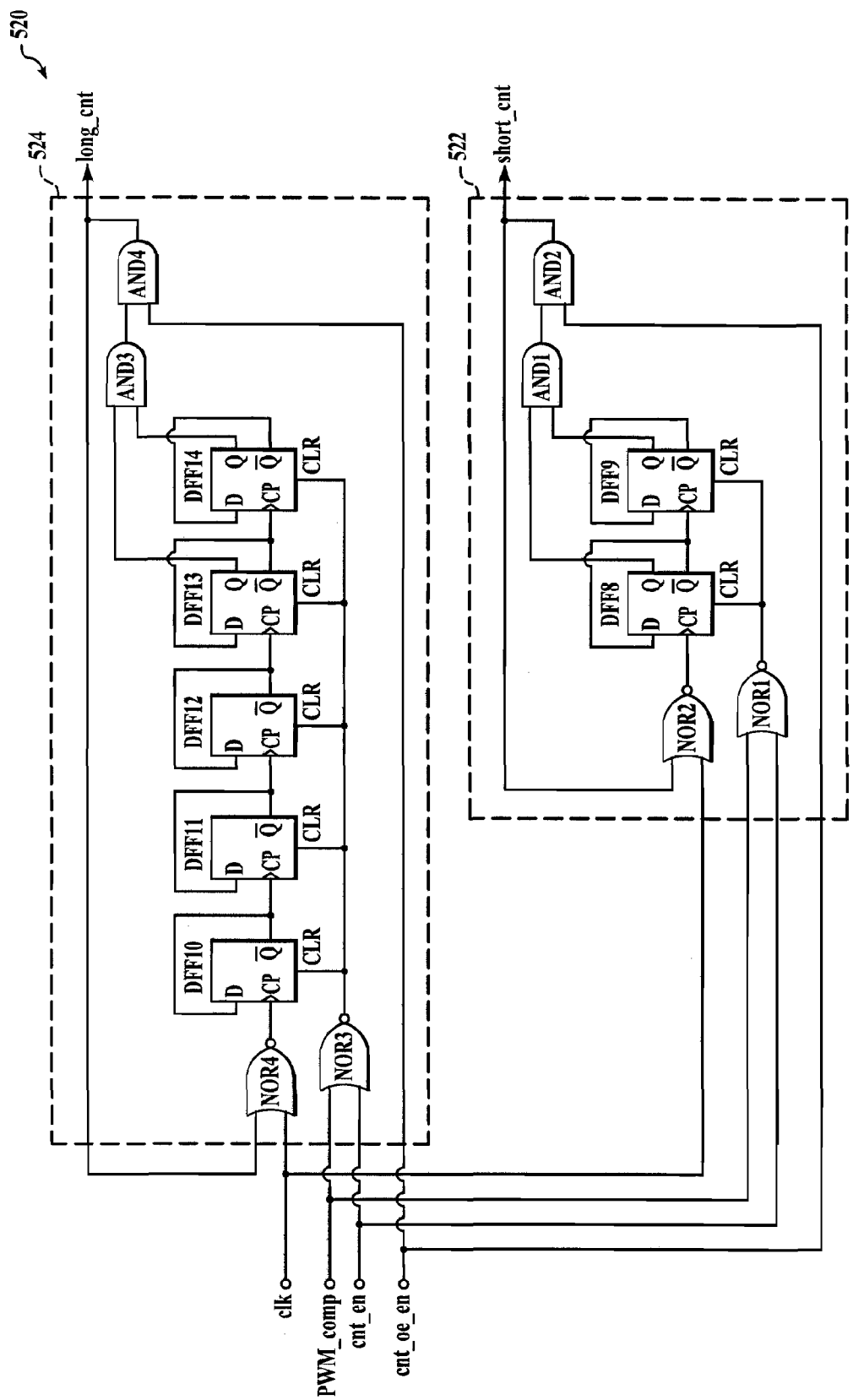
FIG. 5 is a schematic showing an embodiment of a PWM stoppage monitor according to aspects of the present invention.

FIG. 5 is a schematic showing an embodiment of PWM stoppage monitor 520 according to aspects of the present invention. PWM stoppage monitor 520 may be employed as an embodiment of PWM stoppage monitor 320 of FIG. 3 and includes short counter 522 and long counter 524.

As illustrated in an embodiment of FIG. 5, short counter 522 includes logic gates NOR1-NOR2, AND1-AND2, and counter flip-flops DFF8-DFF9. In this embodiment, NOR gate NOR1 is arranged to clear counter flip-flops DFF8-DFF9 when both signal PWM_comp and signal cnt_en are de-asserted. In other embodiments, other logical combinations or circuits may be used to clear counter flip-flops DFF8-DFF9. For example, signals PWM_comp and/or cnt_en may be active low signals, a reset signal may be additionally used, and/or the like. Also in this embodiment, NOR gate NOR2 is arranged to latch the output of short counter 522 when it reaches its defined count and signal cnt_out_en is asserted. In other embodiments, NOR gate NOR2 may be omitted, replaced with an external latch, and/or the like.

In one embodiment, AND gate AND1 is arranged as combinatorial logic to define the count length of short counter 522. However, other logic may be used to define the count length at any suitable number. In certain embodiment, counter flip-flops DFF8-DFF9 make up a counter chain. This counter chain may be modified or replaced, as discussed above. AND gate AND2 is arranged to gate the output of short timer 522 with the signal cnt_out_en in the illustrated embodiment. Many modifications may be made to short counter circuit 522. For example, short counter 522 may be arranged to assert an output signal upon reaching other counts; AND gate AND2 or NOR gate NOR2 may be omitted; other logic added, and/or the like.

Long counter 524 includes logic gates NOR3-NOR4, AND3-AND4 and, counter flip-flops DFF10-DFF14. In certain embodiments, long counter 524 is arranged and operates similarly to short counter 522.

As illustrated in the embodiment of FIG. 5, short counter 522 is arranged to count to three and long counter 524 is arranged to count to 31. As discussed above, short counter 522 and long counter 524 may be arranged to count to any suitable number. In another embodiment, short counter 522 and long counter 524 may share a single counter chain. Other modifications may be made depending on the requirements of each particular application.

Figure 6:
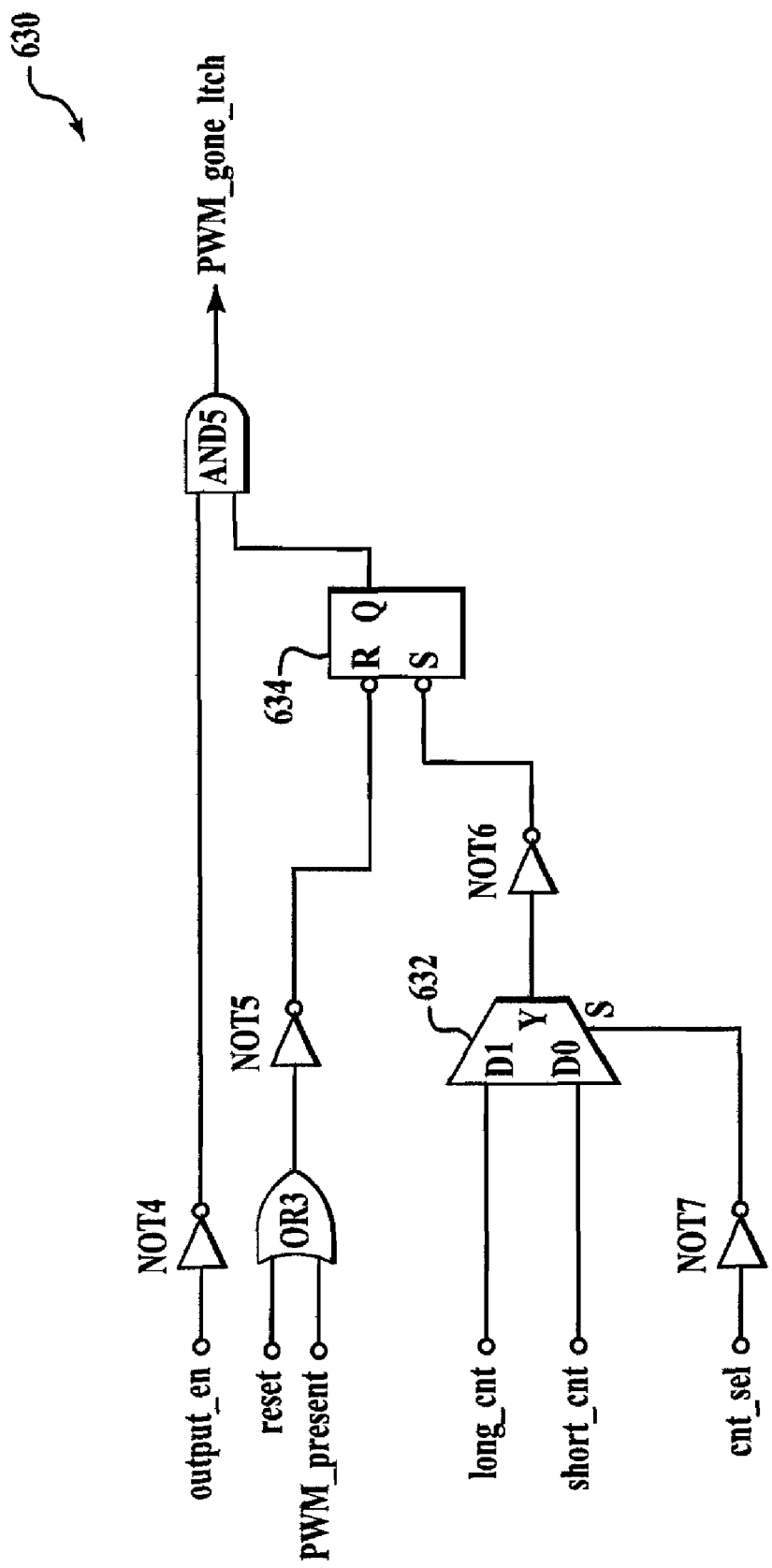
FIG. 6 is a schematic showing an embodiment of a latching circuit according to aspects of the present invention.

FIG. 6 is a schematic showing an embodiment of latching circuit 630 according to aspects of the present invention. Latching circuit 630 may be employed as an embodiment of latching circuit 330 of FIG. 3 and includes multiplexer circuit 632 and R\S\Latch block 634.

Some embodiments of the duty cycle detectors, as disclosed herein, can be employed, for example, in a switching power supply or other regulator that is arranged to regulate an output based, in part, on a PWM signal. In embodiments of these regulators, the duty cycle of a PWM signal may be related to or otherwise indicative of regulation efficiency and the load current. For example, a voltage mode switching regulator may have a maximum duty cycle at which it can no longer sustain regular switching pulses. This "pulse skipping" behavior may generate input current spikes and oscillations on the output of the regulator. Information relating to the regulation efficiency or load current may be used to change operating characteristics of power supply or voltage regulator.

Figure 7:
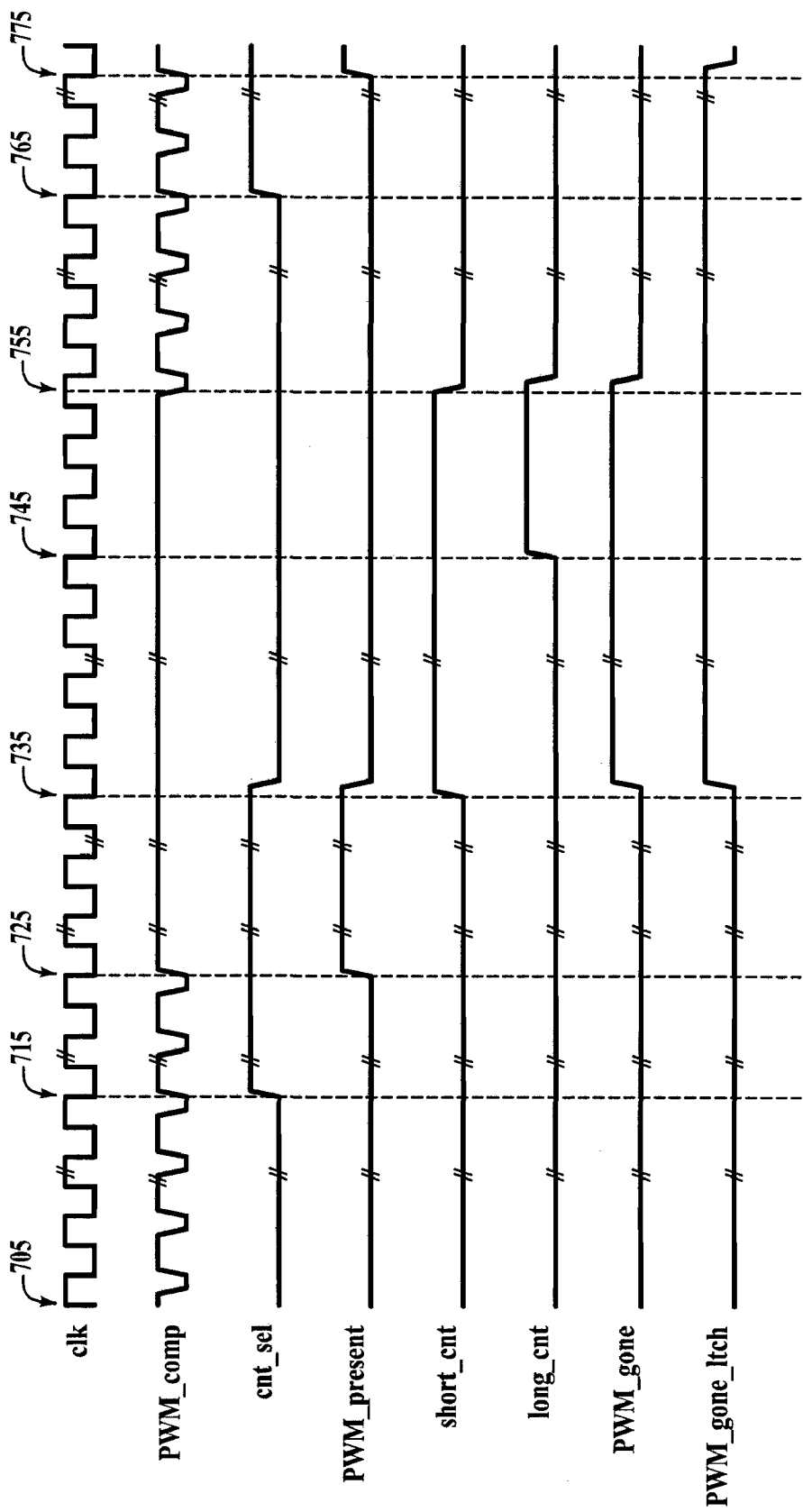
FIG. 7 is a timing diagram illustrating aspects of the operation of a duty cycle detector according to aspects of the present invention.

FIG. 7 is a timing diagram illustrating aspects of the operation of a duty cycle detector according to aspects of the present invention. For example, FIG. 7 represents certain aspects of the operation of duty cycle detector 300 of FIG. 3. Other embodiments of duty cycle detectors may operate differently without departing from the spirit and scope of the invention.

Prior to start time 705, duty cycle detector 300 may be held in reset, not enabled, or otherwise not monitoring input signal PWM_comp. At start time 705, mode monitor circuit 310 begins counting the number of clock cycles during which PWM switching is present. At time 715, mode monitor circuit 310 asserts signal cnt_sel to indicate that PWM switching has been present on signal PWM_comp for a defined number of clock cycles. At time 725, mode monitor circuit 310 asserts signal PWM_present to indicate that PWM switching has been present on signal PWM_comp for another defined number of clock cycles. Also, starting at time 725, PWM switching on signal PWM_comp ceases and PWM stoppage monitor 320 begins counting the number of clock cycles during which there is no PWM switching on signal PWM_comp. PWM stoppage monitor 320 asserts signal short_cnt at time 735. When signal short_cnt is asserted, latch circuit 330 asserts signal PWM_gone which is latched to provide output signal PWM_gone_ltch. Mode monitor circuit 310 also de-asserts signals cnt_sel and PWM_present following time 735. At time 745, PWM stoppage monitor 320 asserts signal long_cnt to indicate that PWM switching has been absent for the number of clock cycles defined by signal long_cnt.

PWM switching on signal PWM_comp resumes at time 755. PWM stoppage monitor 320 then de-asserts signals short_cnt and long_cnt. Multiplexer 332 of latch circuit 330 then de-asserts signal PWM_gone. Mode monitor circuit 310 asserts signal cnt_sel at time 765 after PWM switching has been present on signal PWM_comp for the number of clock cycles defined by signal cnt_sel. At time 775, signal PWM_present is asserted to indicate that PWM switching has been present on signal PWM comp for the number of clock cycles defined by signal PWM_present. Latch 334 of latch circuit 330 is reset by signal PWM_present and output signal PWM_gone_ltch is de-asserted.

Figure 8:
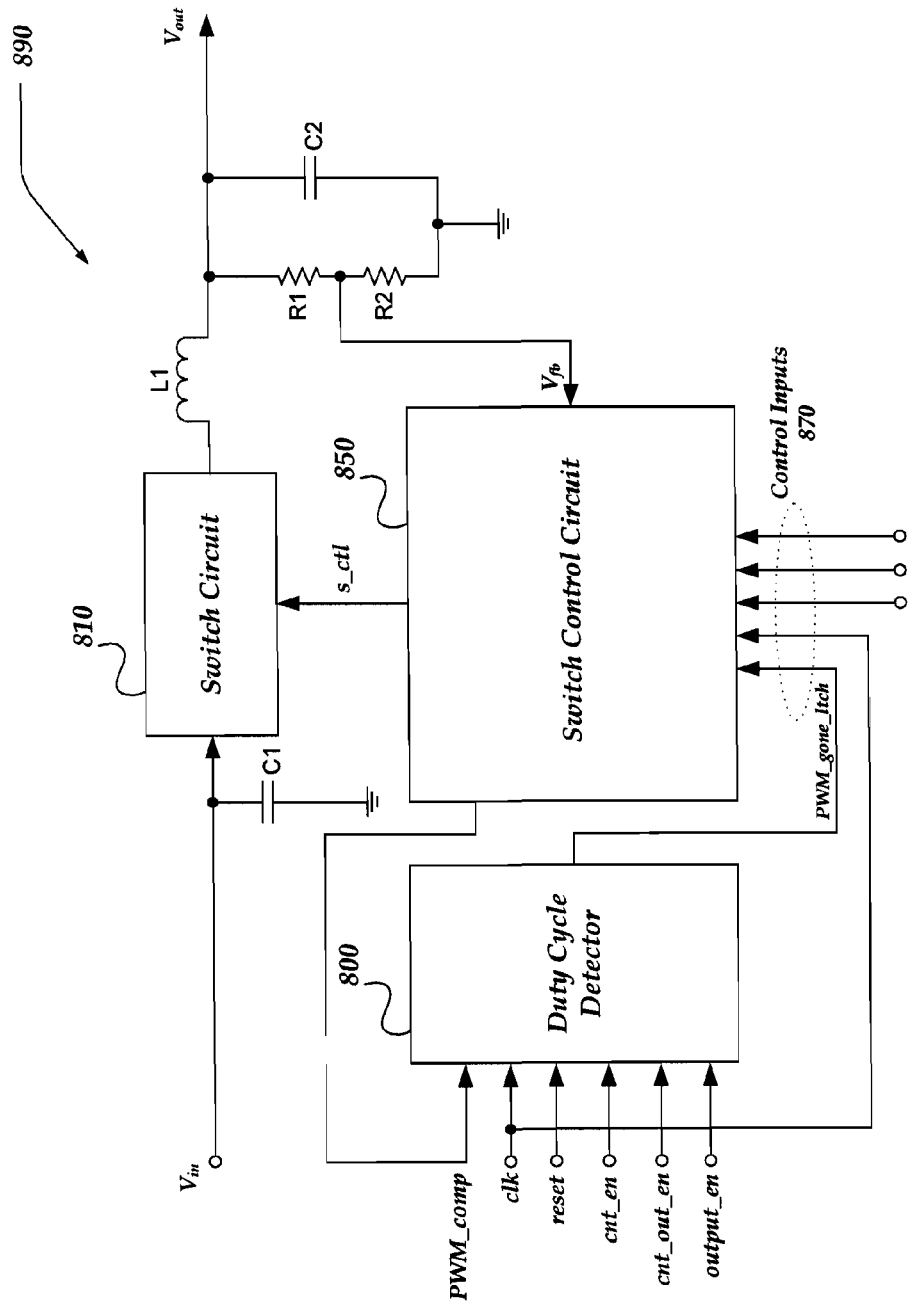
FIG. 8 is a block diagram of one embodiment of a voltage regulator according to aspects of the present invention.

FIG. 8 is a block diagram of one embodiment of voltage regulator 890 according to aspects of the present invention. Voltage regulator 890 includes switch circuit 810, inductor L1, voltage divider resistors R1-R2, input capacitor C1, output capacitor C2, switch control circuit 850 and duty cycle detector 800. In the illustrated embodiment, voltage regulator 890 is a simplified model of a switched mode buck voltage regulator. In other embodiments, duty cycle detector 800 may also be suitably used with boost regulators, buck-boost regulators, inverting regulators, fly-back converters, and/or any type of regulator utilizing a PWM controlled switching device. Such regulators may be voltage mode regulators, current mode regulators, synchronously rectified, asynchronously rectified, and/or the like. These and other variations may be employed for switching regulator circuit 890 without departing from the spirit and scope of the invention.

In one embodiment, switch circuit 810 is arranged to selectively couple $V_{in}$ to inductor L1, consists of one or more switch transistors coupled between $V_{in}$ and inductor L1, and operates under the control of signal s_ctl. In one embodiment, a switch transistor may be an N-channel MOSFET device. However, P-channel MOSFET devices, BJT transistors, JFET transistors, relays, and/or other electrically controlled switching devices may also be suitably used in the same or in other embodiments.

In one embodiment, input capacitor C1 is arranged to provide a low impedance energy source to switch circuit 810. For example, input capacitor C1 may act as a buffer to more quickly provide power to inductor L1 when switch circuit 810 transitions and connects $V_{in}$ to inductor L1. In other embodiments, input capacitor C1 may be omitted.

In a basic mode of PWM operation for some embodiments, switch circuit 810 is closed to selectively couple $V_{in}$ to inductor L1 under the control of switch control circuit 850. While switch circuit 810 is closed, current flows from $V_{in}$ through switch circuit 810 into inductor L1 and also begins charging output capacitor C2. At some point, switch control circuit 850 de-asserts signal s_ctl to open switch circuit 810. While switch control circuit 810 is open, current continues to flow from inductor L1 to output capacitor C2 to charge output capacitor C2 such that it may supply power to a load connected to $V_{out}$. This cycle repeats on a periodic basis.

Inductor L1, input capacitor C1, and output capacitor C2 may be of any suitable values and types that are suitable for the requirements of a given implementation of regulator 890.

As explained briefly above, switch control circuit 850 is arranged to monitor $V_{out}$ or another output voltage relative to a reference voltage source (see FIG. 9) and to control the conduction of switch circuit 810 in certain embodiments. In one embodiment, switch control circuit 850 is arranged to receive input signal $V_{fb}$ and control inputs 870. In this embodiment, $V_{fb}$ is proportional to $V_{out}$ based on the values of voltage divider resistors R1-R2. Control inputs 870 may include clock signal clk, duty cycle detector 800 output signal PWM_gone_ltch, various reference voltages, load current limits or indicators, input current limits or indicators, temperature limits or indicators, compensation signals, mode selection signals, and/or the like.

In certain embodiments, switch control circuit 850 is arranged to close switch circuit 810 on a periodic basis, as determined from clk (e.g., rising edge or falling edge), and opens switch circuit 810 at another time during the clock period. The time during which switch circuit 810 is closed relative to duration of the clock cycle is referred to as the duty cycle of regulator 890. In one embodiment, the duty cycle is controlled by switch control circuit 850 based on the value of $V_{fb}$ relative to a threshold voltage. Accordingly, the duty cycle is related to the load current draw and input voltage $V_{in}$. When load current increases or $V_{in}$ decreases such that regulator 890 reaches its maximum sustainable duty cycle, regulator 890 will enter a pulse-skipping state which may include input current spikes and oscillations on the output of regulator 890. The duty cycle may be adjusted, overridden, or suppressed based in part on control signals 870.

In one embodiment, switch control circuit 850 is arranged to provide signal PWM_comp to duty cycle detector 800. In this embodiment, signal PWM_comp is asserted at the beginning of each clock cycle and is de-asserted to indicate the point at which $V_{fb}$ is equal to a reference voltage. In this embodiment, during PWM regulation, signal PWM_comp is asserted at the beginning of each clock cycle, is de-asserted at one point during the clock cycle. This results in one rising edge transition and one falling edge transition during each clock cycle. However, if regulator 890 is not operating under PWM regulation, signal PWM_comp will not de-assert during a clock cycle. This indicates that the duty cycle is at or above the maximum sustainable duty cycle of regulator 890. In one embodiment, pulse width modulated signal PWM_comp, may be generated from clock signal clk, and an error amplifier or feedback comparator output signal ERR (e.g, see FIG. 9). For example, signal PWM_comp may be provided by pulse width modulating signal ERR.

The reference voltage may be a threshold voltage for opening switch circuit 810. However, signal PWM_comp may be generated based on another reference voltage or voltages; may be asserted and de-asserted at other times; and may be adjusted, overridden, or suppressed based, in part, on the status of control signals 870. The reference voltage(s) may be either internally or an externally generated and may be of any suitable value.

In one embodiment, duty cycle detector 800 is arranged to provide signal PWM_gone_ltch to switch control circuit 850, as discussed above. In this embodiment, switch control circuit 850 uses signal PWM_gone_ltch from duty cycle detector 800 to determine if regulator 890 is in pulse-skipping state. Switch control circuit 850 is arranged to suppress the de-assertion of signal s_ctl if regulator 890 is determined to be in pulse-skipping state. This holds signal s_ctl in an asserted state and holds switch circuit 810 closed. By holding switch circuit 810 closed, $V_{in}$ is effectively coupled to $V_{out}$, and potential short and/or sporadic pulses on signal s_ctl are suppressed. Accordingly, while signal PWM_gone_ltch is asserted, regulation of $V_{out}$ is not performed, and $V_{out}$ is maintained such that it is substantially equal to $V_{in}$. This reduces the potential for increased switching noise and oscillations.

During this time, regulator 890 is not operating under PWM regulation. If the load current decreases, $V_{in}$ increases, or other conditions change such that regulator 890 may again sustain regular PWM switching, signal PWM_comp resumes PWM switching. After PWM switching is present on signal PWM_comp for a sufficient number of consecutive clock cycles, duty cycle detector 800 is arranged to de-assert signal PWM_gone_ltch. In one embodiment, switch control circuit 850 is arranged to then enable the switching of switch circuit 810. The sufficient number of consecutive clock cycles is defined by the hysteretic control, as discussed above.

Duty cycle detector 800 may be condition detector 100 of FIG. 1. In another embodiment, it is duty cycle detector 300 of FIG. 3.

Figure 9:
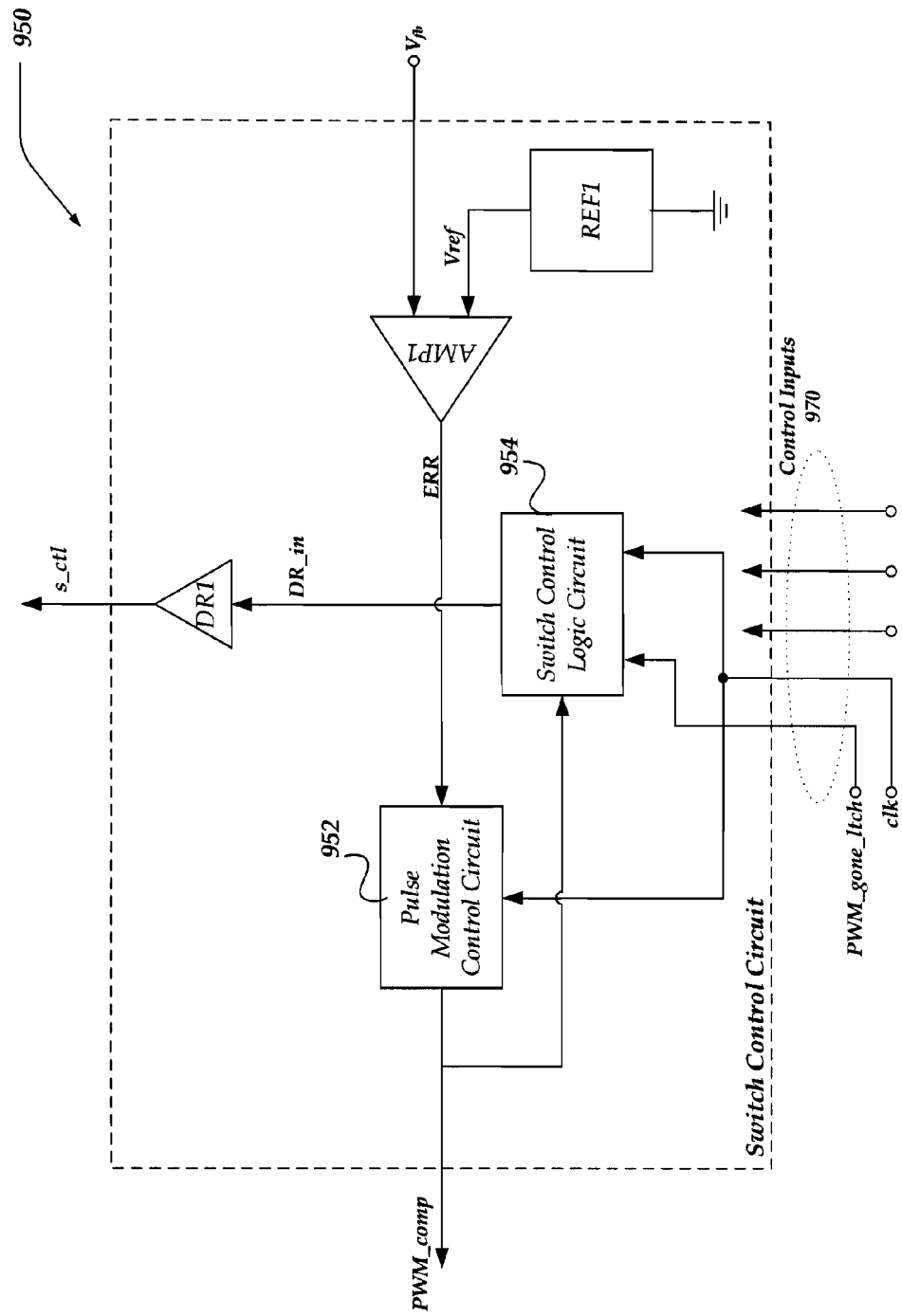
FIG. 9 is a block diagram of an embodiment of a switching control circuit according to aspects of the present invention.

FIG. 9 illustrates a block diagram of an embodiment of switching control circuit 950. Switching control circuit 950 may include, pulse modulation control circuit 952, switch control logic circuit 954, error amplifier AMP1, reference voltage source REF1, and driver circuit DR1. Additionally, although not shown in FIG. 9, other elements such as a capacitor resistor network may be included to control the frequency response of switching control circuit 950.

In one embodiment, switching control circuit 950 is arranged to provide a switch control signal s_ctl to a switch circuit (such as switch circuit 810 of FIG. 8). In one embodiment, error amplifier AMP1 is arranged to provide error signal ERR from signals $V_{fb}$ and $V_{ref}$. In one embodiment, error amplifier AMP1 is arranged to provide signal ERR as a voltage, $V_{err}$. In another embodiment, error amplifier AMP1 is an operational transconductance amplifier (OTA) that is arranged to provide error signal ERR as a current, $I_{err}$. In yet another embodiment, error amplifier AMP1 is replaced with a comparator that is arranged to provide a binary value on signal ERR.

Pulse modulation circuit 952 is arranged provide pulse modulation signal PWM_comp based on the pulse modulation. In one embodiment, pulse modulation control circuit 952 includes a pulse width modulation (PWM) circuit that is arranged to modulate the duty cycle of signal PWM_comp based, in part, on signals ERR and clk. In some embodiments, pulse modulation control circuit includes a pulse frequency modulation (PFM) circuit that is arranged to modulate a frequency of signal PWM_comp during a PFM state of operation. In some embodiments, pulse modulation circuit 952 is arranged to receive input signal clk and to provide PWM_comp based, in part, on signals clk and ERR.

In certain embodiments, switch control logic circuit 954 is arranged to provide signal DR_in based, in part, on signal PWM_comp. The behavior of switch control logic circuit 954 may be modified by control signals 970. For example, output signal DR_in may be suppressed when PWM_gone_ltch is asserted. Driver circuit DR1 is arranged to provide switch control signal s_ctl from signal DR_in.

The above specification, examples and data provide a description of the apparatus, method, and use of thereof of the invention. Since many embodiments of the invention can be made without departing from the spirit and scope of the invention, the invention also resides in the claims hereinafter appended.

What is claimed as new and desired to be protected by Letters Patent of the United States is:

1. A circuit for detecting a condition of a monitored signal, comprising:
   a mode monitor circuit that is arranged to detect a first condition associated with the monitored signal and to assert a first condition signal if the first condition occurs and persists for a first duration;
   a PWM stoppage circuit that is arranged to detect a second condition associated with the monitored signal and to assert a second condition signal if the second condition occurs and persists for a second duration; and a latch circuit that is arranged to provide a status signal, wherein the status signal is based, in part, on the first condition signal and the second condition signal, wherein the mode monitor circuit includes:
    a first counter, wherein the first counter is arranged to count clock cycles during which PWM switching is present on the monitored signal, wherein the first counter is arranged to assert the first condition signal if the first counter reaches a first predetermined value, and wherein the PWM stoppage circuit includes:
    a second counter, wherein the second counter is arranged to count clock cycles during which PWM switching is absent on the monitored signal, and wherein the second counter is arranged to assert the second condition signal if the second counter reaches a second predetermined value.

2. The circuit of claim 1, wherein the latch circuit includes:
a multiplexer that is arranged to receive a plurality of multiplexer input signals and at least one select signal, and is arranged to provide at least one multiplexed signal, and wherein the multiplexed signal is based in part on the plurality of multiplexer input signals and the at least one select signal; and
a latch that is arranged to receive the multiplexed signal and to provide the status signal.

3. The circuit of claim 1, wherein the first duration and second duration are individually configured such that the status signal is provided with hysteresis.

4. The circuit of claim 1, wherein
the PWM stoppage circuit further includes:
    a third counter, wherein the third counter is arranged to count clock cycles during which PWM switching is absent on the monitored signal, wherein the third counter is arranged to assert a third condition signal if the third counter reaches a third predetermined value, wherein the second predetermined value is different than the third predetermined value; and
wherein the latch circuit includes:
    a multiplexer that is arranged to receive the second condition signal, the third condition signal, and at least one select signal; and to provide at least one multiplexed signal, wherein the multiplexed signal is based, in part, on the second condition signal, the third condition signal, and the at least one select signal; and
    a latch that is arranged to receive the multiplexed signal and to provide the status signal.

5. The circuit of claim 1, wherein
the mode monitor circuit is arranged to receive a clock signal, to count the number of clock cycles during which a logic level of the monitored signal changes, and to clear the first counter if there is a clock cycle of the clock signal during which the logic level of the monitored signal is unchanged; and
wherein the PWM stoppage circuit is arranged receive a clock signal, to count the number of clock cycles during which the logic level of the monitored signal is unchanged, and to clear the second counter if there is a clock cycle of the clock signal during which the logic level of the monitored signal is changed.

6. The circuit of claim 1, wherein the second counter is arranged to receive a count enable signal and a count output enable signal, wherein the second counter is arranged such that it is cleared if the count enable signal is asserted, and wherein the second counter is arranged such that the second condition signal is not asserted if the count output enable signal is asserted.

7. The circuit of claim 1, further comprising:
a switch control circuit that is arranged to provide a switch control signal, wherein the switch control signal is based, in part, on the status signal, wherein the latch circuit is arranged to provide the status signal to the switch control circuit; and
a switch circuit that is arranged to receive the switch control signal, and is arranged such that while the switch control signal is asserted, an output voltage is maintained such that it is substantially equal to an input voltage.

8. The circuit of claim 1, wherein the circuit is arranged such that the status signal indicates whether the PWM switching has been detected on the monitored signal, and wherein the PWM stoppage circuit is arranged to provide hysteresis of PWM detection on the monitored signal.

9. A regulator for detecting a condition of a monitored signal, comprising:
a duty cycle detector that is arranged to provide a status signal, wherein the value of the status signal is based, in part, on whether PWM switching occurs and persists for a duration on the monitored signal; and
a switch control circuit that is arranged to provide a switch control signal, wherein during a first operational state of the regulator, the switch control signal is based, in part, on the status signal, wherein the duty cycle detector is arranged receive a clock signal, to detect PWM switching as absent if there is a clock cycle of the clock signal during which the logic level of the monitored signal is unchanged; and, to detect PWM switching as present if there is a clock cycle of the clock signal during which the logic level of the monitored signal is changed.

10. The regulator of claim 9, further comprising:
a switch circuit that is arranged to receive the switch control signal, and is arranged such that while the switch control signal is asserted, an output voltage is maintained such that it is substantially equal to an input voltage.

11. The regulator of claim 9, wherein the duty cycle detector includes:
a mode monitor circuit that is arranged to detect a first condition associated with the monitored signal and to assert a first condition signal if the first condition occurs and persists for a first duration, wherein the mode monitor circuit includes:
    a first counter, wherein the first counter is arranged to count clock cycles during which PWM switching is present on the monitored signal, wherein the first counter is arranged to assert the first condition signal if the first counter reaches a first predetermined value;
a PWM stoppage circuit that is arranged to detect a second condition associated with the monitored signal and to assert a second condition signal if the second condition occurs and persists for a second duration, wherein the PWM stoppage circuit includes:
    a second counter, wherein the second counter is arranged to count clock cycles during which PWM switching is absent on the monitored signal, and wherein the second counter is arranged to assert the second condition signal if the second counter reaches a second predetermined value; and
a latch circuit that is arranged to provide the status signal, wherein the status signal is based, in part, on the first condition signal and the second condition signal.

12. The regulator of claim 11, wherein at least one of the mode monitor circuit or the PWM stoppage circuit is arranged such that at least one of the first duration or the second duration is defined such that pulse-skipping behavior of the regulator is reduced.

13. A method for detecting a condition of a monitored signal, comprising:

detecting a first condition associated with the monitored signal;

if the first condition occurs and persists for a first duration, asserting a first condition signal;

detecting a second condition associated with the monitored signal;

if the second condition occurs and persists for a second duration, asserting a second condition signal;

providing a status signal, wherein the status signal is based, in part, on the first condition signal and the second condition signal if the second condition occurs and persists for a third duration, asserting a third condition signal;

selecting a multiplexed signal from the second condition signal and the third condition signal based on the first condition, and providing the multiplexed signal as the status signal.

14. The method of claim 13, wherein the length of time of the first duration and the length of time of the second duration are individually configured.

15. The method of claim 13, wherein the first condition is a presence of PWM switching on the monitored signal, and second condition is an absence of PWM switching on the monitored signal.

16. The method of claim 15, further comprising:

regulating at least one of an voltage or current based, in part, on the status signal.

17. The method of claim 16, further comprising:

if the status signal is asserted, holding an input power node coupled to an output power node such that while the status signal is asserted, a voltage at the output power node is maintained such that it is substantially equal to a voltage at the input power node.

* * * * *

UNITED STATES PATENT AND TRADEMARK OFFICE
CERTIFICATE OF CORRECTION

| | | |
|---|---|---|
| PATENT NO. | : 7,705,648 B1 | Page 1 of 1 |
| APPLICATION NO. | : 11/697184 | |
| DATED | : April 27, 2010 | |
| INVENTOR(S) | : Juan Paulo Fung | |

It is certified that error appears in the above-identified patent and that said Letters Patent is hereby corrected as shown below:

In column 6, line 23, delete "switching" and insert -- switching. --, therefor.

In column 11, line 62, delete "$V_{in}$," and insert -- $V_{in}$ --, therefor.

Signed and Sealed this

Ninth Day of November, 2010

David J. Kappos
*Director of the United States Patent and Trademark Office*